(12) United States Patent
Krummenacher et al.

(10) Patent No.: US 11,313,881 B2
(45) Date of Patent: Apr. 26, 2022

(54) COMBINATION CURRENT SENSING DEVICE

(71) Applicants: MAGLAB LIMITED, Basel (CH); PERMANENT MAGNETS LIMITED, Maharashtra (IN)

(72) Inventors: Peter Krummenacher, Basel (CH); Sharad Taparia, Mumbai (IN)

(73) Assignee: Pregna International Limited, Mumbai (IN)

( * ) Notice: Subject to any disclaimer, the term of this patent is extended or adjusted under 35 U.S.C. 154(b) by 216 days.

(21) Appl. No.: 16/626,922

(22) PCT Filed: Oct. 5, 2017

(86) PCT No.: PCT/IN2017/050452
§ 371 (c)(1),
(2) Date: Dec. 27, 2019

(87) PCT Pub. No.: WO2019/016822
PCT Pub. Date: Jan. 24, 2019

(65) Prior Publication Data
US 2020/0132725 A1 Apr. 30, 2020

(30) Foreign Application Priority Data
Jul. 17, 2017 (IN) .............................. 201721025393

(51) Int. Cl.
*G01R 1/20* (2006.01)
*G01R 15/14* (2006.01)
(Continued)

(52) U.S. Cl.
CPC ........... *G01R 1/203* (2013.01); *G01R 15/146* (2013.01); *G01R 15/20* (2013.01); *G01R 31/374* (2019.01); *G01R 31/3842* (2019.01)

(58) Field of Classification Search
None
See application file for complete search history.

(56) References Cited

U.S. PATENT DOCUMENTS

| 9,322,850 B2 * | 4/2016 | Wood ..................... G01R 21/14 |
| 2006/0076838 A1 * | 4/2006 | Solveson ............. G01R 15/183 307/651 |

(Continued)

*Primary Examiner* — Jas A Sanghera

(57) ABSTRACT

A combination current sensing device comprising a plurality of current measuring sensors, at least one ambience measuring sensor, a voltage measuring device and a computing device; at least a magnetic field concentrator, and a controlled module assembly constraining the magnetic field concentrator and the bar conductor, in a defined position with respect to one another; the combination current sensing device may have a plurality of incoming connections and a plurality of outgoing connections; and the computing device outputs a validated measure of primary current and an auxiliary information according to a plurality of range and a safe value of the primary current, ensuring functional safety. The voltage measuring device determines a voltage, configured functions and health of an electric source in combination with other sensors and the computing device. One or more of the devices may be optional and or external to the combination current sensing device.

21 Claims, 36 Drawing Sheets

(51) Int. Cl.
  *G01R 15/20* (2006.01)
  *G01R 31/3842* (2019.01)
  *G01R 31/374* (2019.01)

(56) References Cited

U.S. PATENT DOCUMENTS

2015/0160272 A1* 6/2015 Juds .................... G01R 15/207
                                                              324/244
2015/0309080 A1* 10/2015 Chae .................... G01R 15/202
                                                              324/251
2016/0327593 A1* 11/2016 Labbe .................. G01R 15/207

* cited by examiner

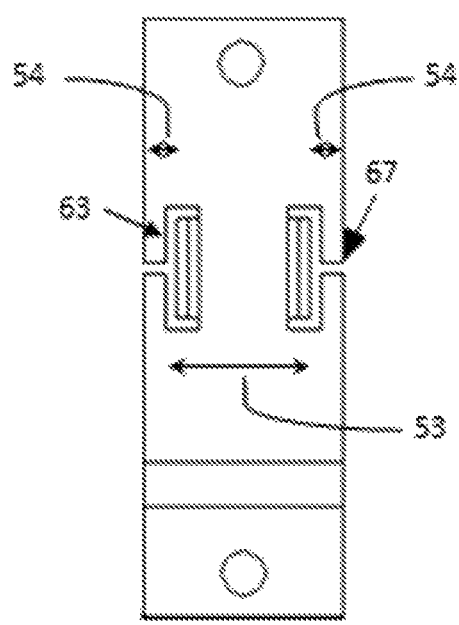 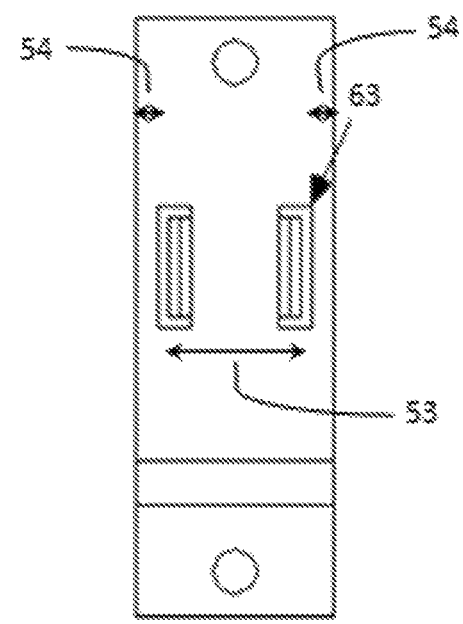
Fig.6B                    Fig. 6C

| 410 — VALIDATED OUTPUT | PRECISION LEVEL — 420 |
|---|---|
| VALUE 1 | 1 |
| VALUE 2 | 2 |
| VALUE 3 | 3 |
| VALUE 4 | 4 |
| VALUE 5 | 5 |
| VALUE 6 | 6 |
| VALUE 7 | 7 |
| VALUE 8 | 8 |
| VALUE 9 | 9 |
| VALUE 10 | 10 |
| VALUE 11 | 11 |
| VALUE 12 | 12 |

Fig. 18

COMBINATION CURRENT SENSING DEVICE

FIELD OF INVENTION

This invention relates to detection and measurement of electric current.

BACKGROUND

Several current sensing and measuring techniques are known. One of the most commonly deployed methods for current sensing and measuring is by a shunt resistor, wherein the shunt resistor is placed in series with the system load and a voltage is generated across the shunt resistor. The current is calculated from the measured voltage using Ohm's law. Other sensing techniques include use of a Rogowski coil in which the Rogowski coil is placed around a current-carrying conductor and a voltage gets induced in the coil that is proportional to the current. Magnetic sensors and notably Anisotropic Magneto-Resistance (AMR), Giant Magneto-Resistance (GMR) and Magnetic Tunneling Junction (MTJ) magnetic thin film sensors are also in use.

U.S. Pat. No. 8,461,835B2, discusses use of shunt resistor and magnetic current sensor, wherein switching is performed such that shunt resistor measurement is used for lower current measurements and magnetic detection is used for measurement of larger current with an aim of achieving lower power consumption while sensing. Patent application No: US2015/0309080A1 describes deploying a Hall sensor and a shunt on a conductor, along with a Hall Core and a microprocessor. Patent no. EP1939635A1 conceptually mentions about a device for measuring electric current that implements two Hall sensors arranged in a slot-like recess provided in a conductor wherein the Hall unit is separated from the conductor by an insulating material. However, no constructional aspects are described. Patent no. EP2511714A2 likewise describes a sensor assembly comprising a sensor device for non-contact detection along with another sensor device for contact based detection of electrical current. The sensor devices have a common measurement range. An analog-digital converter converts analog measured values from sensor device into digitized measured values. The sensor devices and analog-digital converter are claimed to be arranged on a common circuit carrier. U.S. Pat. No. 9,322,850B2 discloses a current measurement apparatus for measuring current that may comprise a shunt resistor, a current transformer, a Rogowski coil, a Hall Effect sensor or any other electromagnetic current sensor, wherein a reference signal of significantly different frequency is superimposed on measured signal. U.S. Pat. No. 9,297,836B2, describes a sensor for sensing current, having an inductor for sensing alternating current, a magnetic sensor for sensing direct current, a sensor fusion circuit that determines an aggregated sensed current based on the filtered alternating current signal component and the filtered direct current signal component. U.S. Pat. No. 8,461,825B2 discloses a current measuring apparatus that comprises a shunt resistor, wherein an electrically insulating and thermally conducting material is provided between each side face of the shunt resistor and the terminal member to provide a thermal path for heat exchange between the shunt resistor and the terminals which functions as a heat sink to control the temperature of the shunt resistor.

With products performances becoming a key competitive advantage and electricity use in devices on the ever rise, redundant and reliable measurement of electric current is of utmost importance At the same time, such background products as measurement devices are generally accommodated in non-premium space and need to be more and more compact.

A typical application for redundant current sensor with requisite voltage isolation as safety requirement exists, for example in management of Batteries in Hybrid Electric Vehicles and Electric Vehicles.

Present invention addresses such emerging gaps.

Objectives

The objective is to invent a current sensing device that measures electric current reliably.

Another objective is to invent a current sensing device that measures electric current redundantly.

Another objective is to invent a compact current sensing device.

Another objective is to invent a current sensing device that has minimum measurement variation due to manufacturing variation in volume production.

Another objective is to invent a current sensing device that measures the electric current with precision over a wide range.

Another objective is to invent a current sensing device that is modular in design in order to be scalable as per application.

Another objective is to invent a current sensing device that is suitable for large variation in ambient temperature.

Another objective is to invent a current sensing device that provides auxiliary information in addition to measure of electric current.

Another objective is to invent a current sensing device that can be combined with a temperature and a voltage sensor in order to be used in Battery Management System measuring state of charge, state of function and state of health.

SUMMARY OF INVENTION

The present invention is a combination current sensing device connectible in a series path of an electric circuit. The combination current sensing device comprises a plurality of current measuring sensors, a plurality of ambience measuring sensors, a voltage measuring device and a computing device. Outputs of the current measuring sensors and the ambience measuring sensors are inputted to the computing device and the computing device outputs a validated measure of a primary current lye flowing in the electric circuit in which the combination current sensing device is connected in series connection with an electric source on one end and an electric load on other end. The voltage measuring device determines a voltage of the electric source, while the voltage measuring device in combination with the current measuring sensors and ambience measuring sensors determines a capacity and a health of the electric source. A magnetic current measuring sensor is mounted on a circuit board assembly along with the computing device and associated circuitry. The circuit board assembly is disposed on a bar conductor. A resistance current measuring sensor is non-separably integrated with the bar conductor. The temperature sensor is fixed on the resistance current measuring sensor or the bar conductor. The bar conductor has a plurality of joining means. The magnetically unrequired width of the bar conductor is trimmed in the vicinity of the magnetic current measuring sensor to a reduced width to improve magnetic field intensity in a magnetic field concentrator. Due to this inventive construction, the magnetic current measuring device also produces better measurement results when deployed in a multiphase current application wherein a mutual interference between magnetic fields of different phases, also known as a "cross-talk", is simulated to reduce to less than 10%. A combination of calibrated airgap and magnetic material is deployed. A low airgap is provided for current measurements of small value and a high airgap is provided for current measurement of large value. The magnetic current measuring sensor is disposed as a controlled module assembly so the magnetic field concentrator is assembled around the bar conductor at a predetermined position.

As another embodiment, the resistance current measuring sensor is incorporated in and as the reduced width of the bar conductor. A temperature measuring sensor integrated with the magnetic current measuring sensor, termed as an integrated temperature-magnetic sensor is mounted on the circuit board assembly and the circuit board assembly is disposed on the reduced width of the bar conductor such that the integrated temperature-magnetic measuring sensor is thermally coupled to the resistance current measuring sensor.

An output of the magnetic current measuring sensor, an output of the resistance current measuring sensor and an output of the temperature sensor is inputted to the computing device. The computing device determines in which range does the measure of the intended current fall and accordingly applies a set of instructions to generate a validated output of the primary current. A range is a pre-defined lowest to highest value of the electric current measure which the combination current sensing device as per present invention is designed to encounter for application where deployed. The range is further sub-divided as per the number and capacity of current measuring sensors deployed. Further, in every application, the user knows that in case of error in measurement, he would prefer to err on a lower side or on a higher side of the measure. A concept of a safe value of measure is accordingly introduced. The computing device verifies that measured value of the magnetic current measuring sensor as well as of the resistance current measuring sensor falls in the appropriate range and outputs a value of the validated measure of primary current obtained from an output of appropriate sensor. If any or all current measuring sensors are operational but outside a tolerance limit, then the computing device invokes a fault mode and outputs the next best value of the primary current, ensuring at all times to output the safe value in accordance with actual application where the combination sensing device as per present invention is deployed. For embodiments with a plurality of incoming connections and or a plurality of outgoing connections, another consistency check of equality of a summation of incoming electric current and outgoing electric current is performed by the computing device. Thus, at all times the user gets an output from the computing device along with the precision level, so the user knows also about health of combination current sensor and can initiate repair and maintenance action.

BRIEF DESCRIPTION OF DRAWINGS

FIG. 3 is a single conductor schematic of current measuring sensors and ambience measuring sensor for the first embodiment, while
FIG. 6A is an exploded view showing a slot in the bar conductor and a magnetic field concentrator, while
FIG. 6B and FIG. 6C show a top view of the bar conductor having the slot.
FIG. 8 is an exploded view of a controlled module assembly while
FIG. 13 is a schematic of current measuring sensors and ambience measuring sensors for yet another embodiment; while
FIG. 18 is an illustrative tabulation of auxiliary information.

DETAILED DESCRIPTION OF INVENTION

The present invention shall now be described with the aid of drawings. It is to be expressly understood that several variations are possible based on present invention and the description should not be construed to limit the invention in any manner whatsoever.

Figure 1:
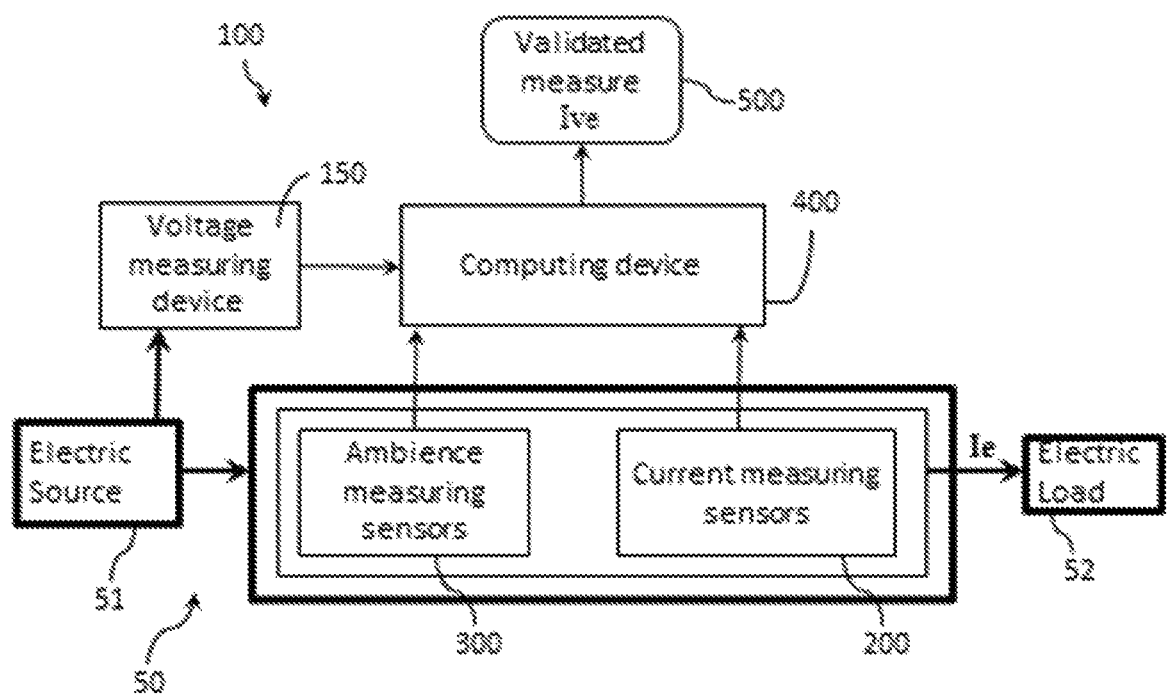
FIG. 1 is a block diagram of concept of present invention.
Figure 1A:
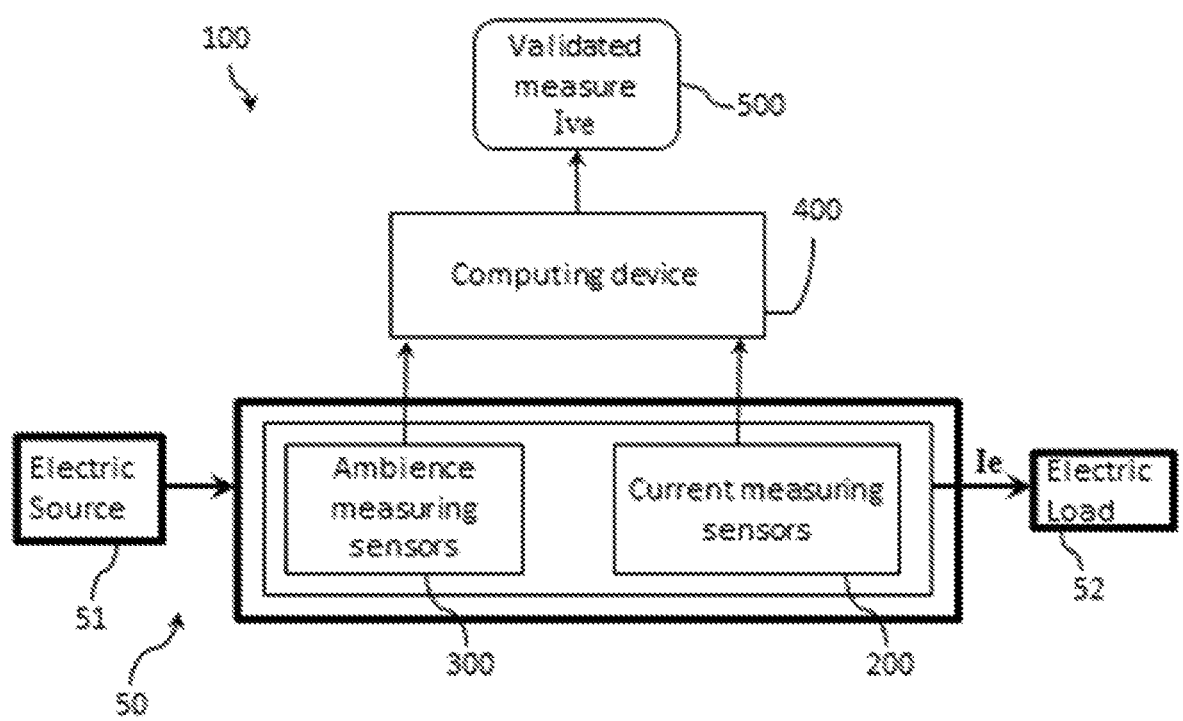
FIG. 1A to FIG. 1D are block diagrams of variations of concept of present invention.
Figure 1B:
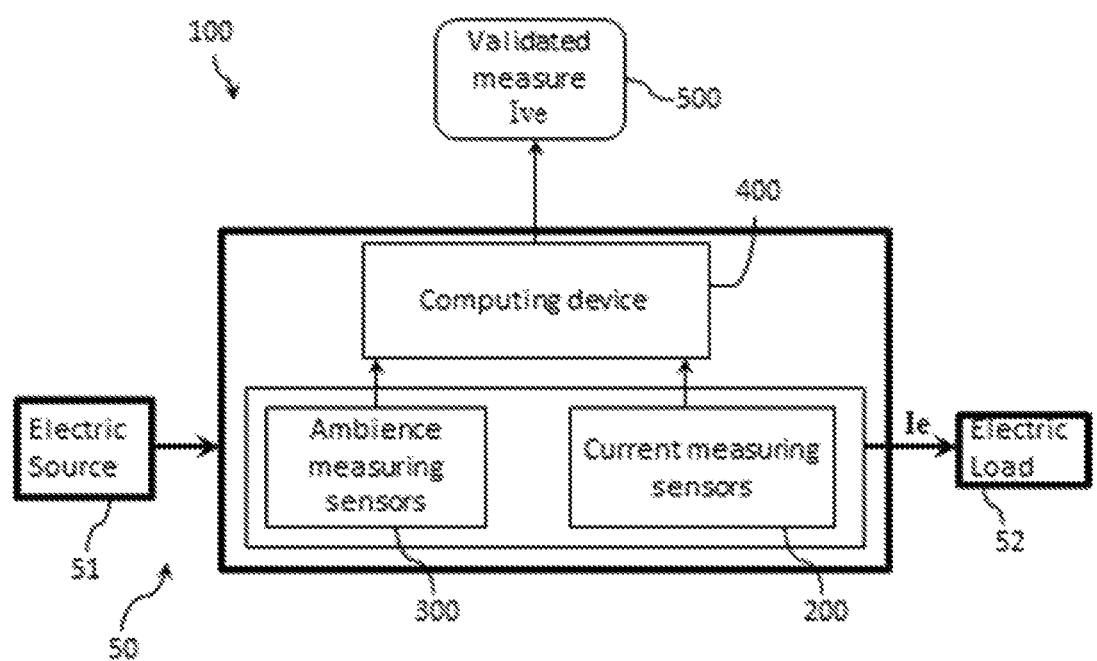
Figure 1C:
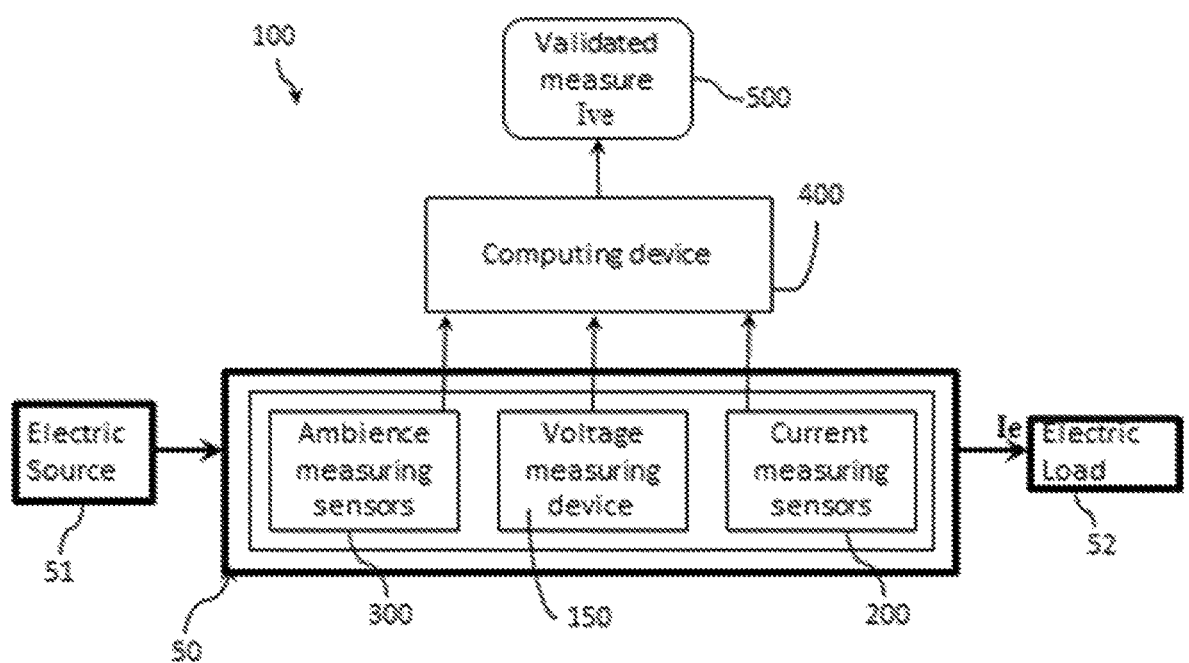
Figure 1D:
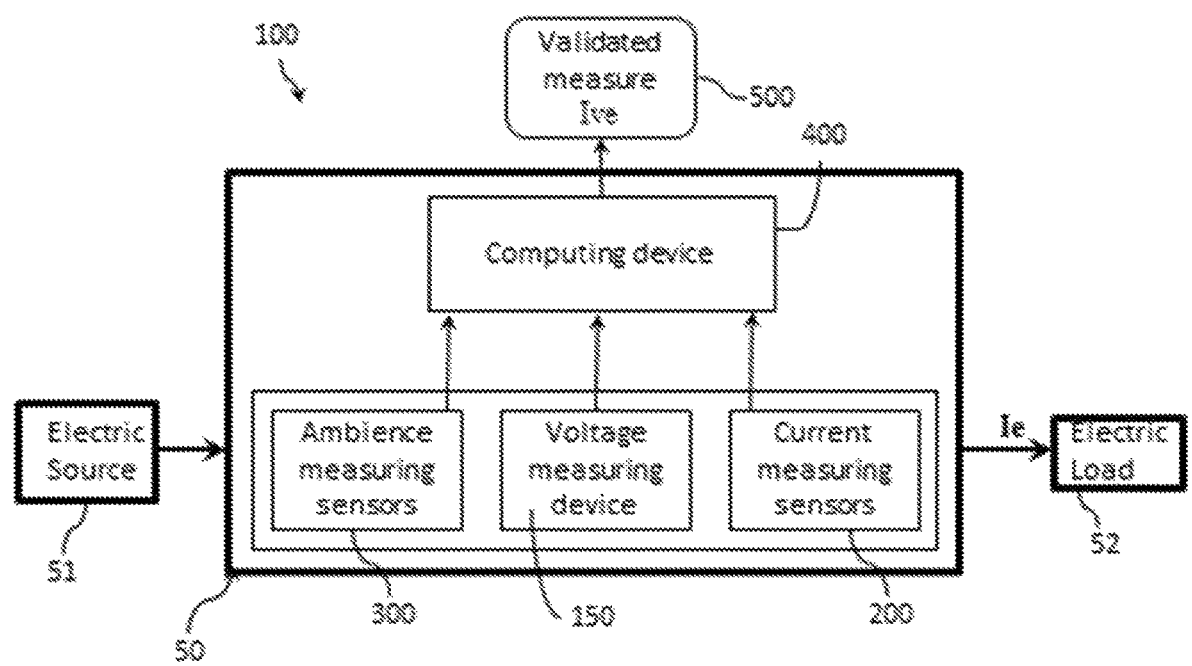
Figure 13:
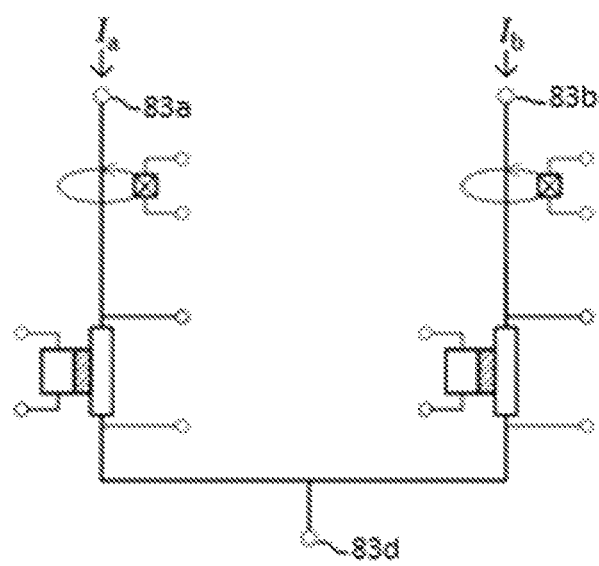
Figure 13A:
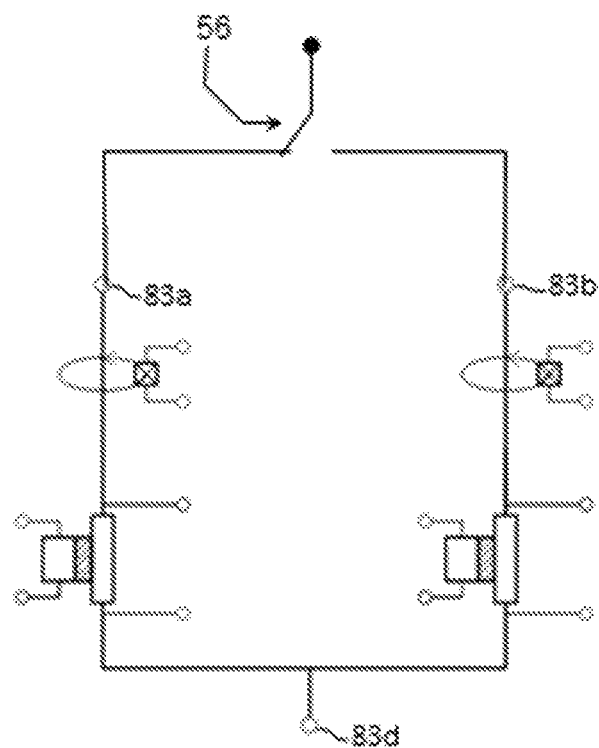
FIG. 13A is yet another variation with a switching and FIG. 13B is a bock diagram corresponding to this variation.
Figure 13B:
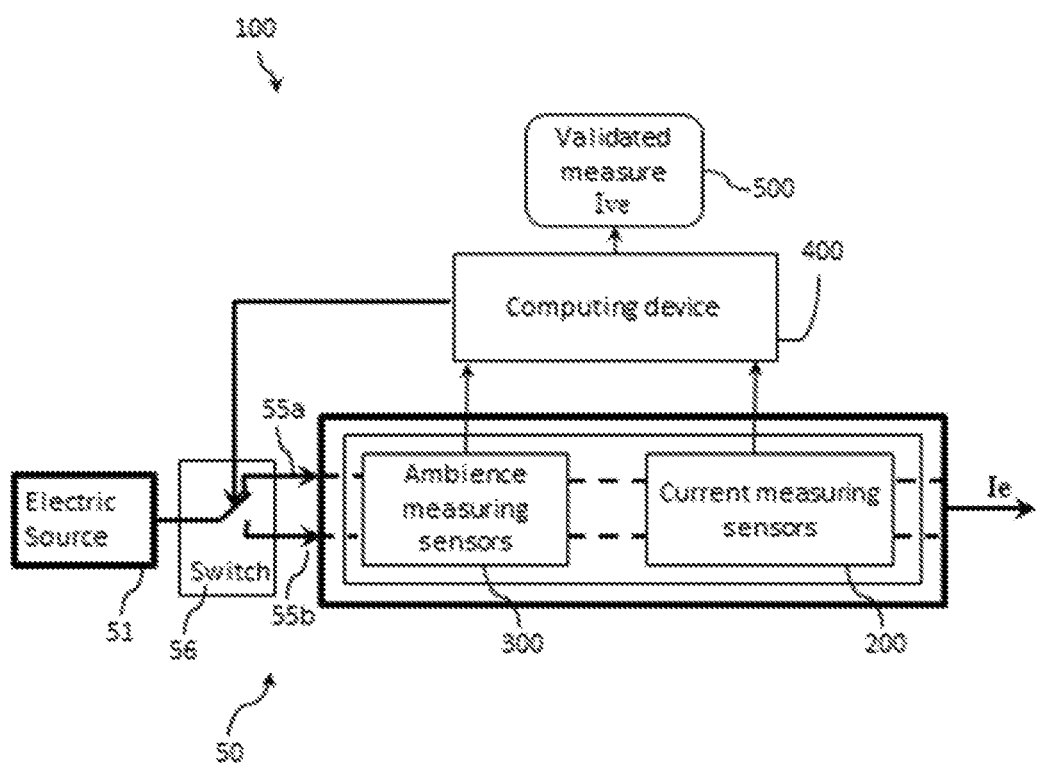

The present invention is a combination current sensing device connectible in the series path of an electric circuit. FIG. 1, the combination current sensing device (100) comprises a plurality of current measuring sensors (200), a plurality of ambience measuring sensors (300), a voltage measuring device (150) and a computing device (400). FIG. 1A to FIG. 1D and also FIG. 13B are different variations with one or more constituents absent or are external to or are integrated with the combination current sensing device (100) or an additional constituent added to achieve a desired process as described later.

The plurality of current measuring sensors (200) comprises a plurality of magnetic current measuring sensors and a plurality of impedance current measuring sensors. The impedance current measuring sensors include resistance current measuring sensors. Outputs of the current measuring sensors (200) and the ambience measuring sensors (300) are inputted to the computing device (400) and the computing device (400) outputs a validated measure of a primary current (500) Ive flowing in the electric circuit (50) in which the combination current sensing device (100) is connected in series connection, with an electric source (51), which could be a voltage source or a current source, on one end and an electric load (52) on other end.

Figure 2:
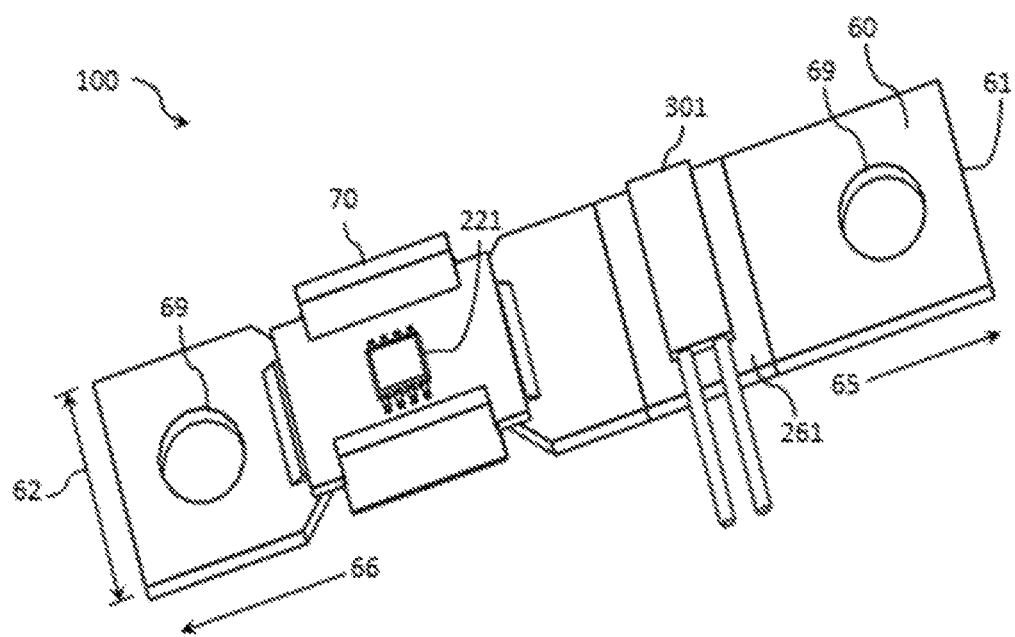
FIG. 2 is a partial perspective view of a first embodiment.
Figure 3:
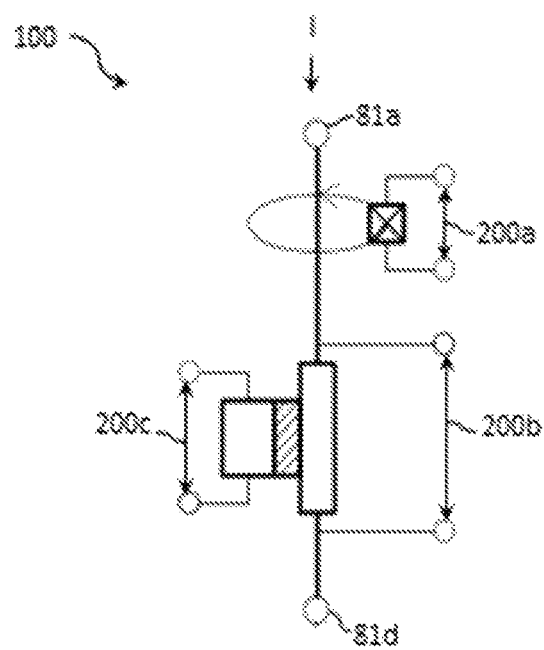
Figure 3A:
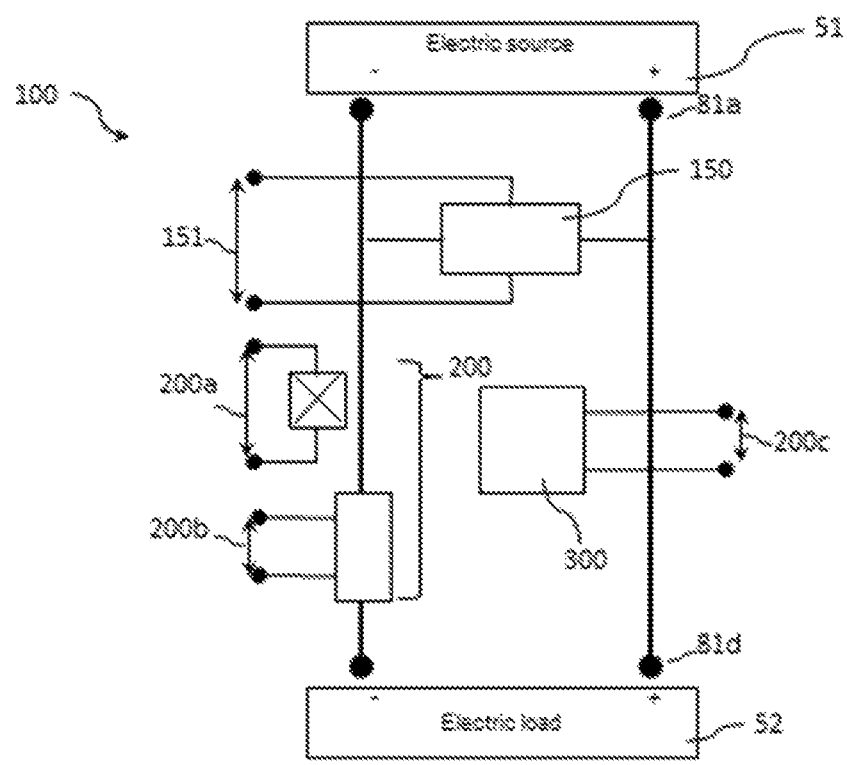
FIG. 3A is a two conductor schematic including a voltage measuring device.

FIG. 2 and FIG. 3 pertain to a first embodiment of the combination current sensing device (100) as per present invention with the plurality of current measuring sensors (200) of FIG. 1 comprising a magnetic current measuring sensor (221) and a resistance current measuring sensor (261), while the ambient measuring sensor (300) comprises a temperature sensor (301). While FIG. 3 shows a single conductor schematic, FIG. 3A shows a two conductor schematic and also shows a voltage measuring device (150). The magnetic current measuring sensor (221) is mounted on a circuit board assembly (30) along with the computing device (400) and associated circuitry, the circuit board assembly (30) disposed on a bar conductor (60). The bar conductor (60) is made of copper, silver, gold or aluminum or an alloy thereof or any other industrially used good conductor of electricity usable for carrying electric current as per application. The resistance current measuring sensor (261) is non-separably integrated with the bar conductor (60). The temperature sensor (301) is fixed on the resistance current measuring sensor (261). The bar conductor (60) has a plurality of joining means (69). The ambience measuring sensor (300), including the temperature sensor (301) may be disposed anywhere on the bar conductor (60), either on or in a vicinity of the impedance current measuring sensor (261, 271 and or 272) or in a vicinity of the bar conductor (60).

Figure 4:
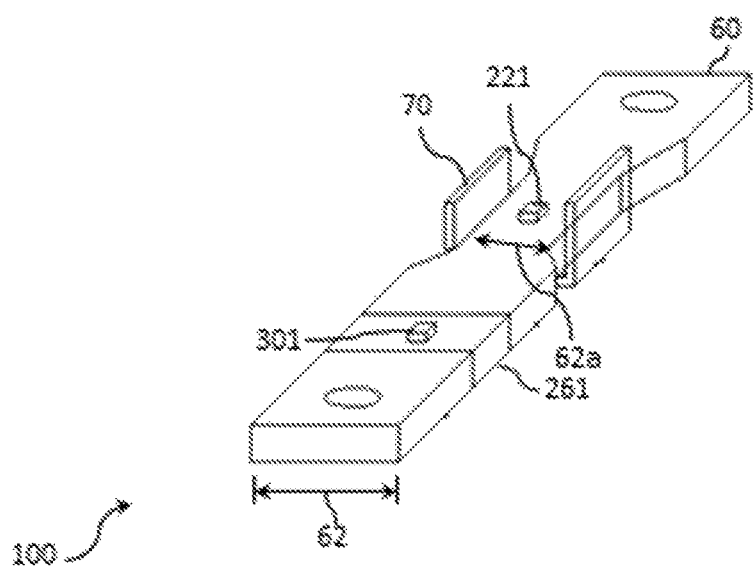
FIG. 4 is another partial perspective view of the first embodiment.

The bar conductor (60) generally has a rectangular face (61) and a bar width (62) as shown in FIG. 4, and having an area of cross-section commensurate with the maximum electric current of the electric circuit (50) and a time for which the current flows, so that a temperature rise consequent to heat generated does not deteriorate the bar conductor (60) nor the components disposed thereon and or in the vicinity. The bar conductor (60) also has a plurality of referencers (64) as shown at least in FIG. 8E. The plurality of referencers (64) shown in this embodiment are a plurality of projections, however, they could also be a plurality of holes or a plurality of notches, wherefrom a fixing reference is taken, hence the term referencer appropriately defines such a construction. The resistance current measuring sensor (261), commonly used being a shunt resistance is generally an alloy with low temperature coefficient and consistent resistivity. One such material commonly used as the shunt resistance is manganin having about 84 to 88% copper, 10 to 14% manganese and 1 to 4% Nickel. As a low cost embodiment, a defined part of the bar conductor (60) with voltage measurement terminals is the shunt resistance, functioning as the resistance current measuring sensor (261). The resistance current measuring sensor (261) is permanently disposed in the bar conductor (60), towards a first side (65) of the bar conductor (60) such that the electric current passing through the first side (65) of the bar conductor (60) also passes through the resistance current measuring sensor (261).

Figure 7:
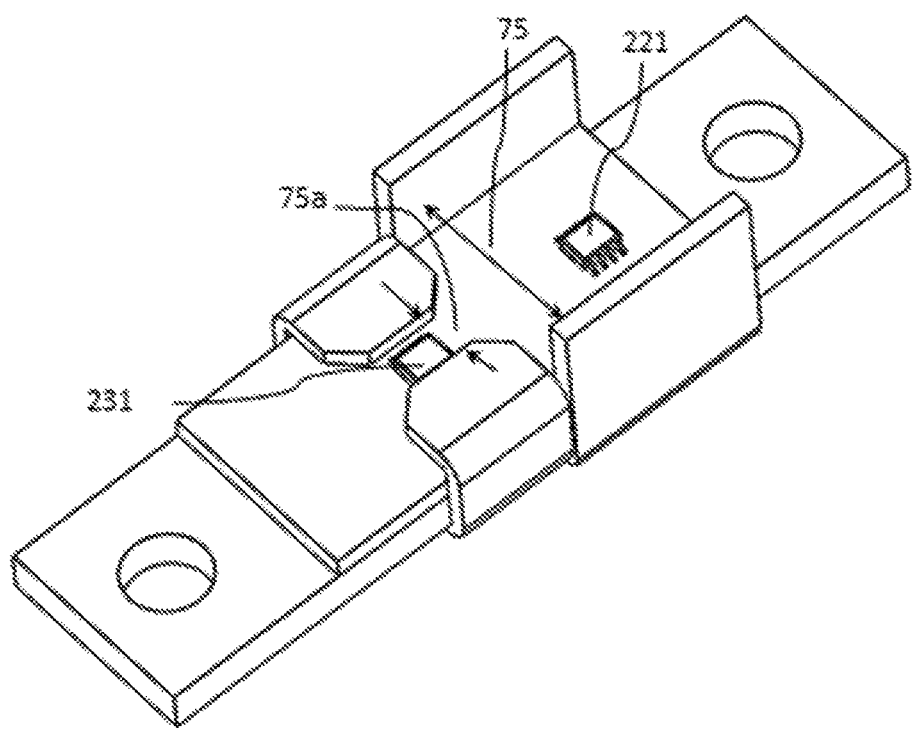
FIG. 7 is a partial perspective view showing airgaps in magnetic field concentrator(s).
Figure 7A:
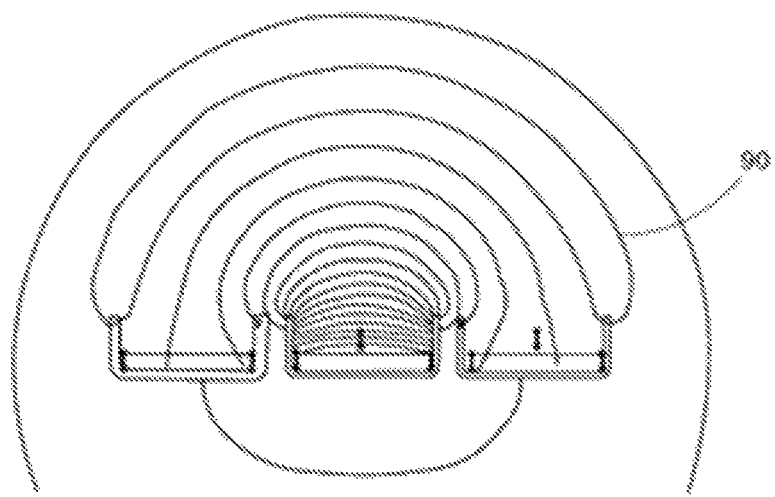
FIG. 7A shows a distribution of magnetic lines of forces and FIG. 7B shows another distribution of magnetic lines of forces.

The magnetic current measuring sensor (221) is disposed towards a second side (66) of the bar conductor (60). A magnetic field concentrator (70) is surroundingly disposed around the bar conductor (60) substantially equally spread around the magnetic current measuring sensor (221) present on the bar conductor (60). The bar conductor (60) has a cross-section commensurate with current and duration of current flow and is generally wider than needed to merely dispose the magnetic current measuring sensor (221). In other words, width of the bar conductor (60) is decided based on thermal consideration and not magnetic consideration. This magnetically unrequired width of the bar conductor (60) results in undesired distancing of the magnetic lines of forces (90), generated by the electric current flowing in the bar conductor (60), from the magnetic current measuring sensor (221) and thus causing relatively weaker linkage of the magnetic field with the magnetic current measuring sensor (221). FIG. 7A.

FIG. 4, as per present invention, the magnetically unrequired width of the bar conductor (60) is optionally trimmed in the vicinity of the magnetic current measuring sensor (221) to a reduced width (62a), to improve magnetic field intensity in the magnetic field concentrator (70). The magnetic field concentrator (70) surroundingly disposed around the bar conductor (60) with the reduced width (62a), due to which a width of the magnetic field concentrator (70) also correspondingly reduces, therefore becomes more effective in linking the magnetic field with the magnetic current measuring sensor (221) and in avoiding stray loss of magnetic field in the surrounding.

Figure 7B:
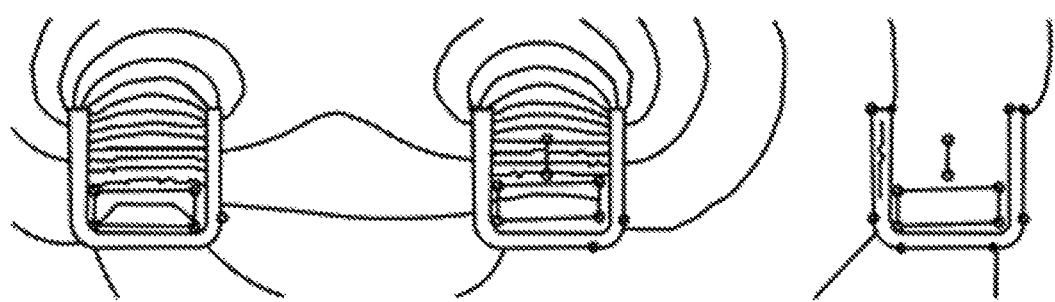

Due to this inventive construction, the magnetic current measuring device (221) provided in the combination current sensing devices (100) also produces better measurement results when deployed in a multiphase current application as elaborated by FIG. 7A and FIG. 7B, wherein a mutual interference between magnetic fields of different phases, also known as a "cross-talk", is simulated to reduce to less than 10%.

Figure 5:
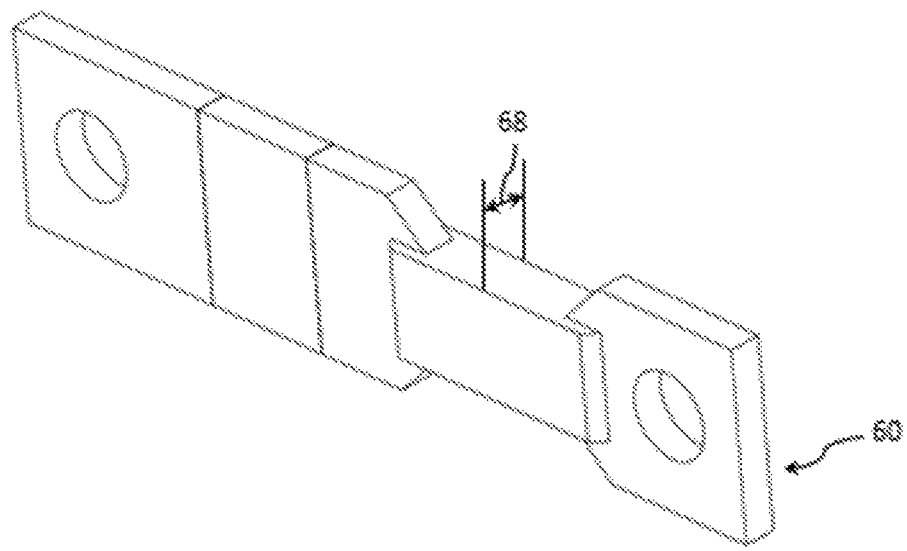
FIG. 5 is a perspective view of a bar conductor.
Figure 6A:
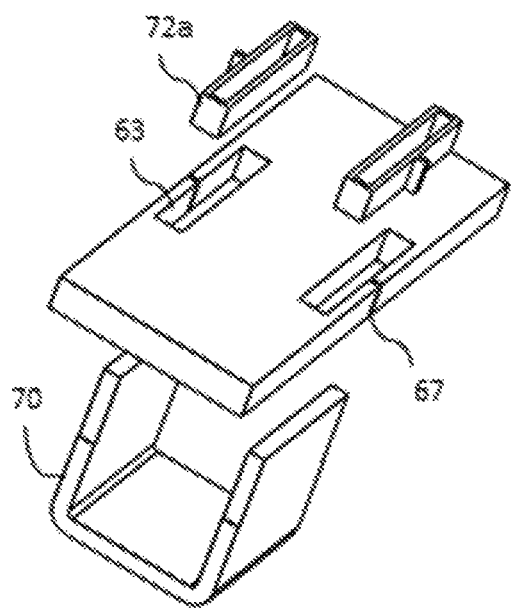

Consequent to the reduced width (62a) for a limited length and thereby reduced cross-section of the bar conductor (60), the bar conductor (60) may be excessively hot. To offset this potential disadvantage, the bar conductor (60) as per present invention has an increased thickness (68) locally as shown in FIG. 5 so that a cross section of the bar conductor (60) remains substantially unaltered even when the bar width (62) is locally the reduced width (62a) to improve magnetic linkage. FIG. 6A, as another variation, a pair of slots (63) is provided in the bar conductor (60) and the magnetic field concentrator (70) is made to pass through therefrom. The slot (63) is an open slot with a slit (67) on an outer side (54) as shown in FIGS. 6A and 6B or the slot (63) is a closed slot as shown in FIG. 6C. When the slot (63) is an open slot, the entire primary current (500) flows through an inner side (53) of the bar conductor (60) and the magnetic field thus created corresponds to a full measure of the electric current. When the slot (63) is a closed slot, only a part of the primary current (500) flows through an inner side (53) of the bar conductor (60) and the magnetic field thus created corresponds to a part measure of the electric current. Either of such inventive construction does not materially reduce effective thermal mass of the bar conductor (60), which governs the heat generation; and thus the heat generation is unaltered and is substantially the same in all the three situations, namely when there is no slot (63) or when there is a closed slot or when there is an open slot.

Figure 6D:
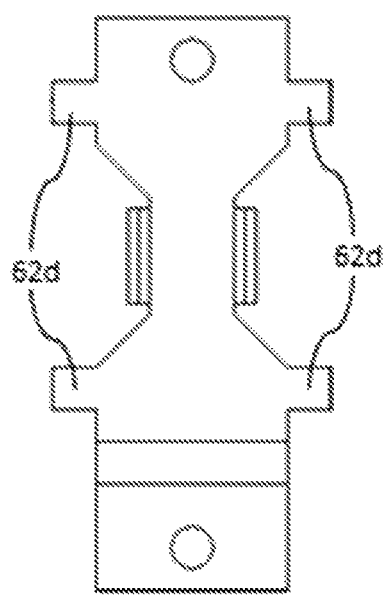
FIG. 6D shows a top view of another construction of the bar conductor.

FIG. 6D, as another embodiment, the bar conductor (60) has a plurality of heat diffusers (62d) for conducting and radiating away heat. The heat diffusers (62d) is an additional conducting mass as well as an additional surface area, either integral to the bar conductor (60) or added on to the bar conductor (60).

In embodiments with the slot (63), a filler material (72a), which is an electrical insulator and simultaneously a thermal conductor, is disposed all around the magnetic field concentrator (70) in the slot (63), preferred material being "silica" or silicon dioxide sheet, or industrial grade thermally conducting electrically insulating paste, also termed as a thermal grease. FIG. 6A.

Accuracy of measurement of electric current using magnetic current measuring sensor (221) also relies on magnetic saturation of the magnetic field concentrator (70). Magnetic saturation results in non-linear reflection of magnetic field beyond a value of electric current causing it. Magnetic saturation can be avoided by use of higher cross section of a magnetic material used for making the magnetic field concentrator (70) or by using special materials. In the present invention, a combination of calibrated airgap and magnetic material is deployed which does not let the magnetic path to saturate. A low airgap (75a) is provided for current measurements of small value and a high airgap (75) is provided for current measurement of large value. FIG. 7.

When a plurality of magnetic current measuring sensors (221, 231 and or 232) is disposed, the magnetic field concentrator (70) can be constructed such that magnetic field concentrators (70) can be a different component for each magnetic current measuring sensor (221, 231 and or 232), each with a different calibrated airgap; alternatively such magnetic field concentrator (70) can be a single component with a plurality of calibrated airgaps corresponding to each magnetic current measuring sensor. In embodiments with the slot (63), the magnetic field concentrator (70) may consist of more than one sub-part, integrated, in order to achieve required shape and results.

Further, the magnetic current measuring sensor (221, 231 and or 232) is a non-contact sensor, which implies that measurement of current is NOT by measuring the current actually flowing but is measured by sensing a magnetic effect of current on mechanically arranged devices, thus termed as "in a magneto-mechanical manner". Thus, it is important that the mechanical manner, which essentially is a relative placement of the magnetic field concentrator (70), the bar conductor (60) and the magnetic current measuring sensor (221) has a defined relation and has minimal variation during industrial production.

Figure 8:
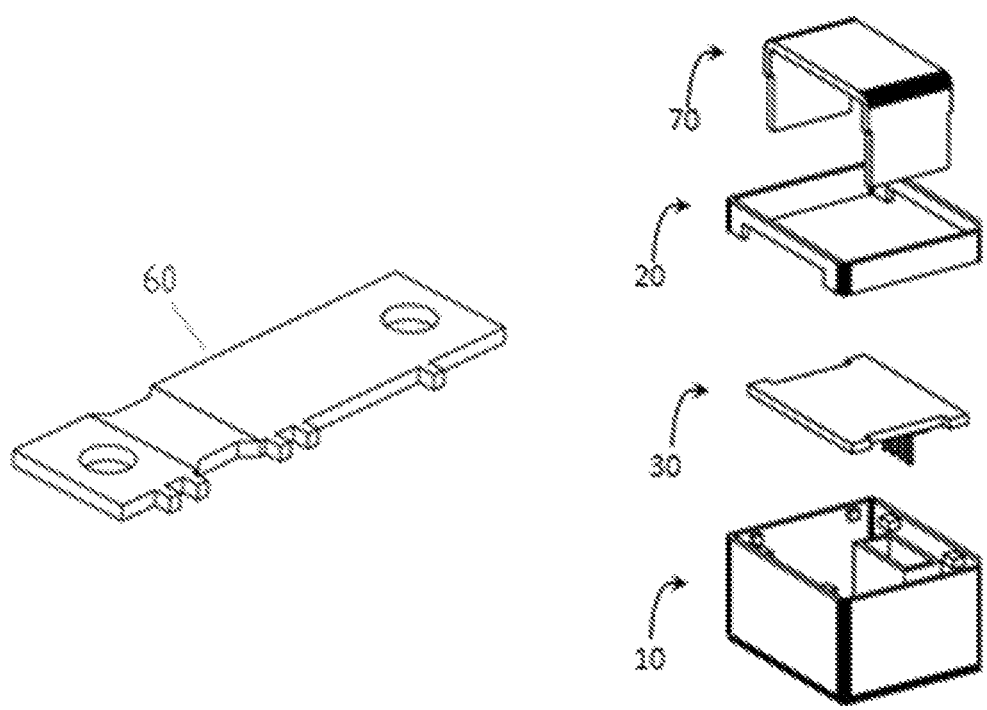
Figure 9:
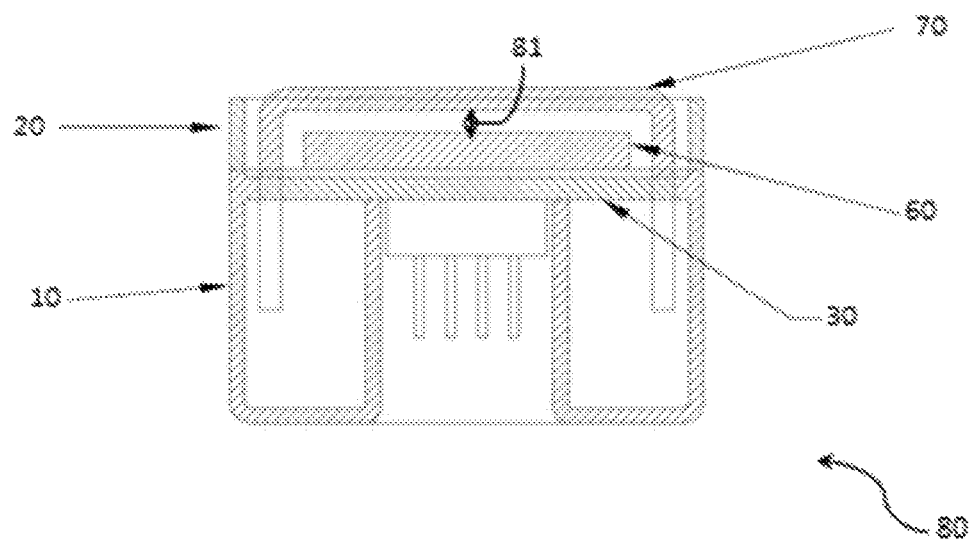
FIG. 9 is a sectional side view of the controlled module assembly.

FIGS. 8 and 9, the magnetic current measuring sensor (221) is disposed as a controlled module assembly (80) comprising a base chamber (10), a circuit board assembly (30), the magnetic field concentrator (70) and an open cover (20), assembled around the bar conductor (60) at a predetermined position.

Figure 8A:
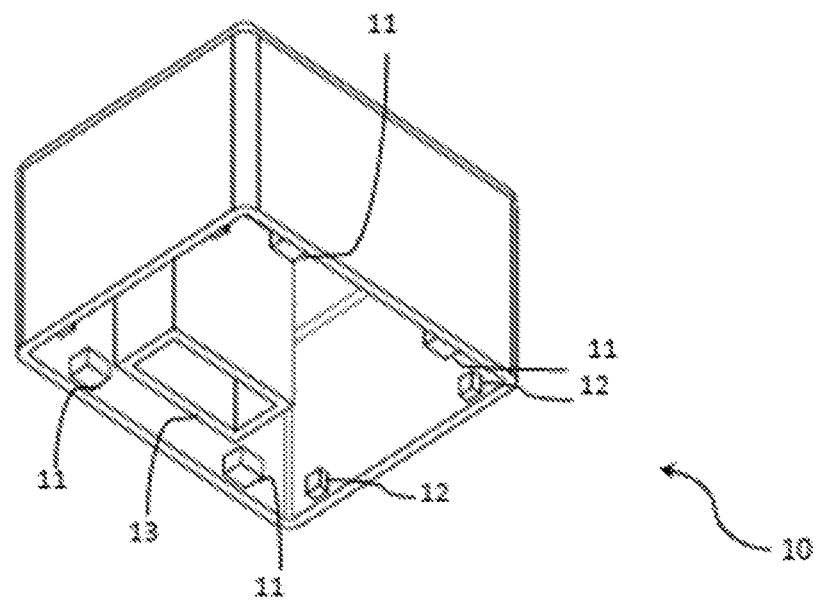
FIGS. 8A to 8E are various components with related details.

FIG. 8A, the base chamber (10) has a plurality of bar locators (11) in the inside near an open side of the base chamber (10) and a plurality of board locators (12) leaving some room to accommodate a thickness of the circuit board assembly (30). There is provided a tunnel (13) running between the open side and a closed side of the base chamber (10).

Figure 8B:
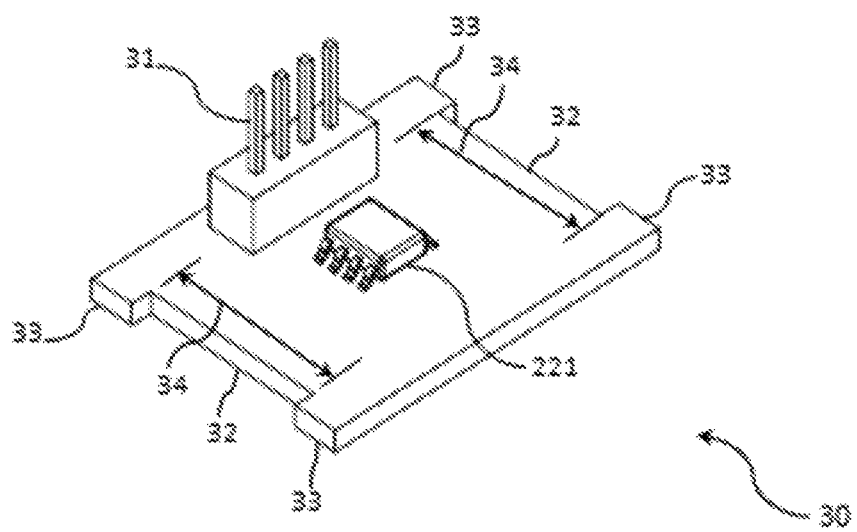

FIG. 8B, the circuit board assembly (30) has a connector (31) and one or more magnetic current measuring sensors (221) at a definite position, besides the computing device (400) and several other operational electronic components. The circuit board assembly (30) also has an open passage (32) on either side, and four extended legs (33).

Figure 8C:
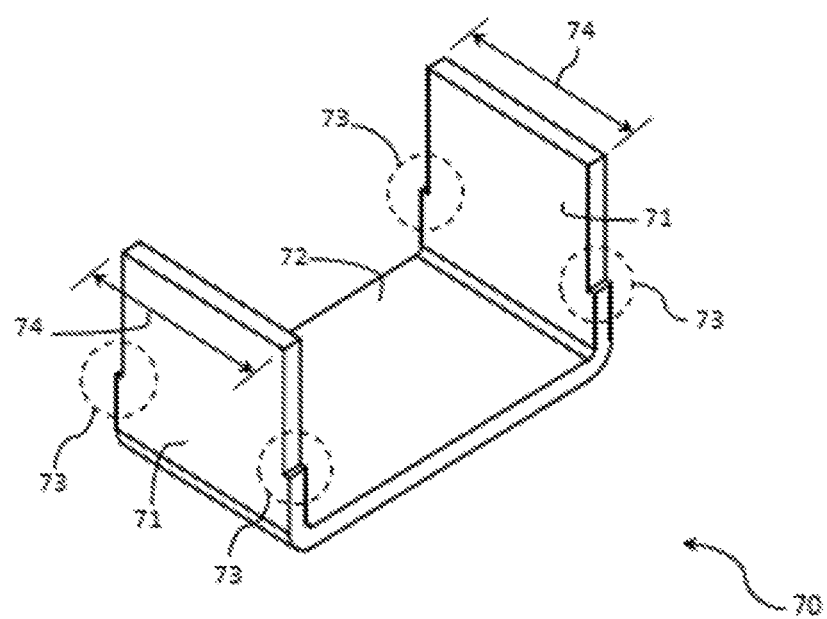

FIG. 8C, the magnetic field concentrator (70) comprises at least two parallel walls (71) and a joining wall (72). Each parallel wall (71) has at least one step (73) on either side so that a length (74) of the edge of each parallel wall (71) is marginally less than a passage width (34) of the open passage (32) of the circuit board assembly (30).

Figure 8D:
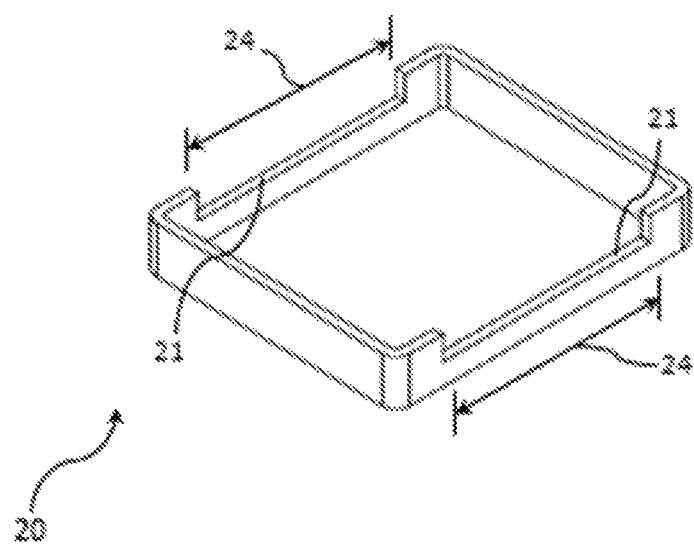
Figure 8E:
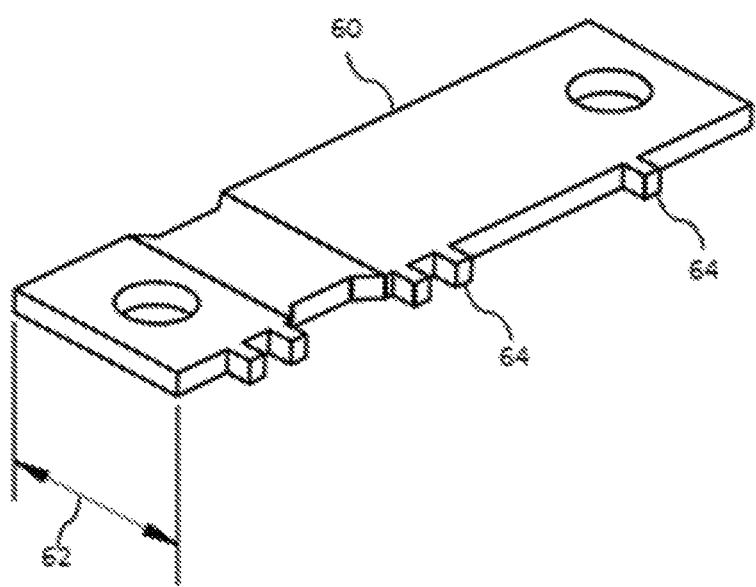

FIG. 8D, the open cover (20) has bar slots (21) on two opposite sides of a slot width (24) slightly more than the bar width (62) of the bar conductor (60).

The controlled module assembly (80) is put together by,
(a) Placing the circuit board assembly (30) on the board locators (12) in the base chamber (10).
(b) Placing the bar conductor (60) on the base chamber (10) within the bar locators (11) of the base chamber (10) such that the base chamber (10) is constrained within the plurality of referencers (64) on the bar conductor (60).
(c) Placing the parallel walls (71) of magnetic field concentrator (70) in the open passage (32) of the circuit board assembly (30), such that the steps (73) on the parallel walls (71) stop against the extended legs (33) of the circuit board assembly (30).
In this situation, FIG. 9,
(1) there is a pre-determined gap (81) between the bar conductor (60) and the magnetic field concentrator (70).
(2) the connector (31) on the circuit board assembly (30) gets accommodated and is accessible through the tunnel (13) of the base chamber (10).
d) Placing the open cover (20) such that the open cover (20) is constrained by the bar conductor (60) passing through the bar slots (21) of the open cover (20).
e) Filling an insulating resin through the open cover (20). As therefore can be understood, the magnetic current measuring sensor (221), the magnetic field concentrator (70) and the bar conductor (60) are constrained in a definite position with respect to one another in all the three orthogonal axes, maintaining a prescribed electrical isolation between the bar conductor (60) and the magnetic field concentrator (70).

Figure 9A:
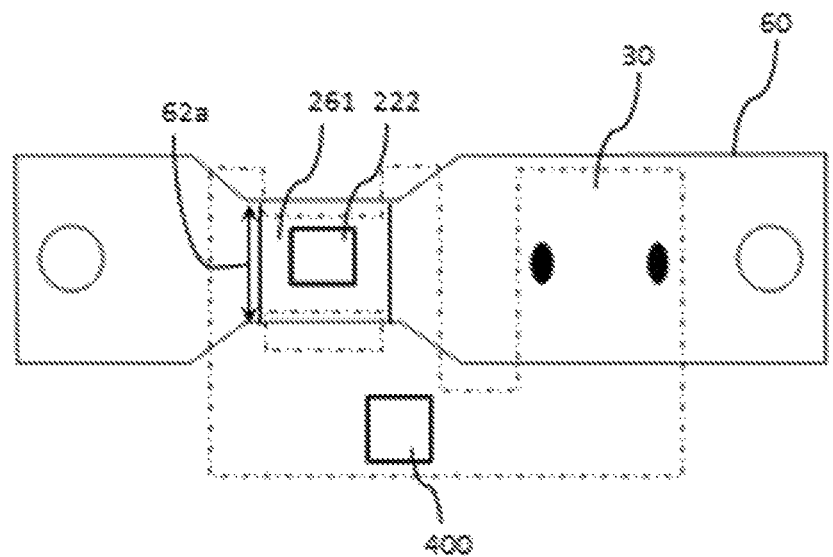
FIG. 9A is another top view of the bar conductor with an outline of a circuit board assembly.

FIG. 9A, as another embodiment, the resistance current measuring sensor (261) is incorporated in and as the reduced width (62a) of the bar conductor (60). A temperature measuring sensor integrated with a magnetic current measuring sensor, termed as an integrated temperature-magnetic sensor (222) is mounted on the circuit board assembly (30) and the circuit board assembly (30) is disposed on the reduced width (62a) of the bar conductor (60) such that an integrated temperature-magnetic measuring sensor (222) is thermally coupled to the resistance current measuring sensor (261). One of the many ways to achieve such thermal coupling is to dispose the circuit board assembly (30) such that an upper face of the integrated temperature—magnetic sensor (222) is thermally coupled to the resistance current measuring sensor (261) while a lower face of the integrated temperature-magnetic sensor (222) is mechanically and electrically fixed on the circuit board assembly (30). This embodiment results in a compact combination current sensing device (100) which is more efficient and economical due to a reduced overall length of the bar conductor (60).

Figure 17:
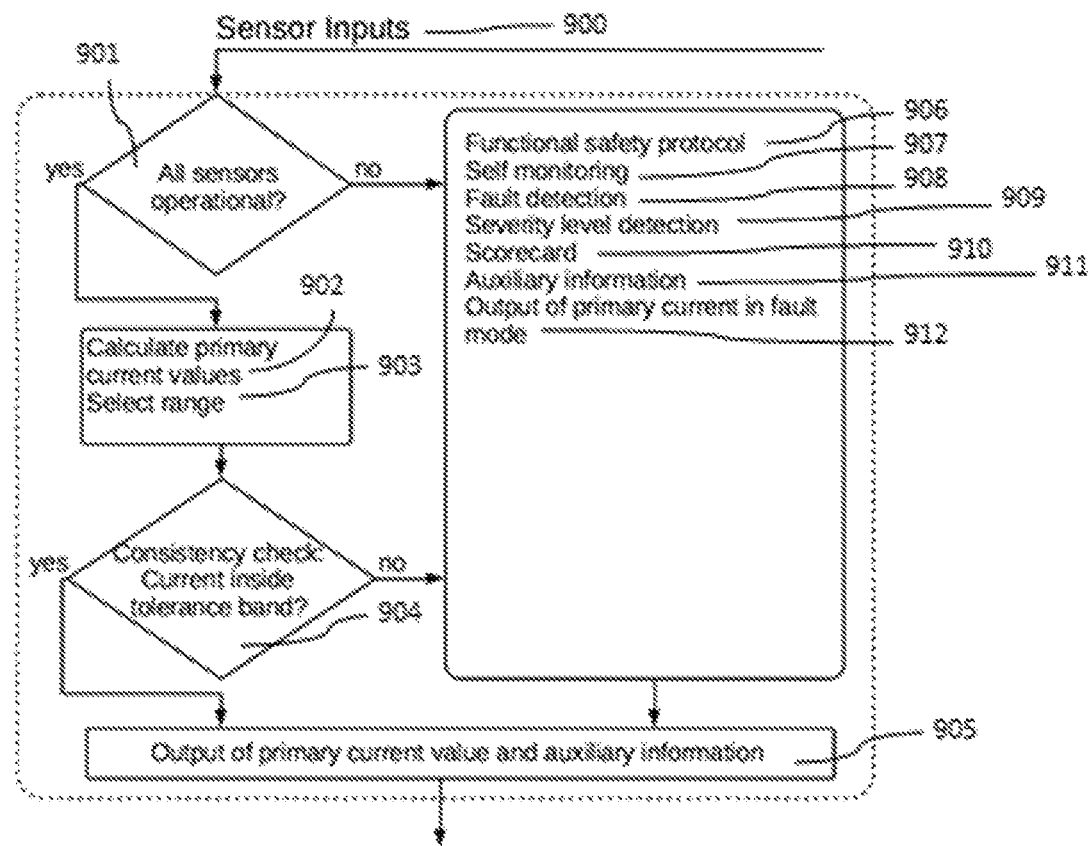
FIG. 17 is a flow diagram of execution by a computing device.

The combination current sensing device (100) of FIG. 2, FIG. 3 and FIG. 3A as per present invention functions as described herein below with the help of FIG. 17.

Figure 10:
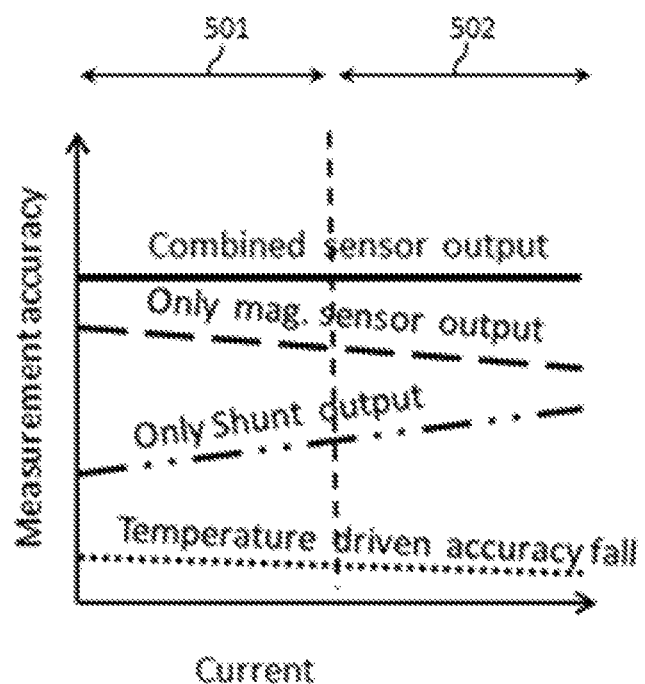
FIG. 10 is a line graph illustrating accuracies of sensors over different ranges.

An output (200a) of the magnetic current measuring sensor (221), an output (200b) of the resistance current measuring sensor (261) and an output (200c) of the temperature sensor (301) is inputted (900) to the computing device (400). Based on the outputs (200a) and (200b) of the plurality of the current measuring sensors (200), the computing device (400) determines in which range does the measure of the intended current fall and accordingly applies a set of instructions to generate a validated output of the primary current (500). FIG. 10 further describes concept of the range for present invention. A range is a pre-defined lowest to highest value of the electric current measure which the combination current sensing device (100) as per present invention is designed to encounter for application where deployed. The range is further sub-divided as per the number and capacity of current measuring sensors (200) deployed. For this embodiment, the range of electric current measure is divided into a first range (501) and a second range (502).

Further, in every application, the user knows that in case of error in measurement, he would prefer to err on a lower side or on a higher side of the measure. For example, in applications where higher current flow is preferred, the user would prefer to err on a lower value. In applications where higher current flow is unsafe, the user would prefer to err on a higher value. In the present invention, concept of a safe value of measure is accordingly introduced.

For this illustrative application, the magnetic current measuring sensor (221) selected and used is more accurate in the first range (501) and the resistance current measuring sensor (261) is more accurate in the second range (502). If the value of the primary current (500) measured falls in the first range (501), then the computing device (400) executes as follows:

(1) Verify that measured value of the magnetic current measuring sensor (221) as well as of the resistance current measuring sensor (261) falls in the appropriate range (903) which is the first range (501), which implies that the current measuring sensors (200) are operational (901).
(2) Apply consistency check, like verify that the difference in value of measured current by the magnetic current measuring sensor (221) and the resistance current measuring sensor (261) is less than a prescribed percentage (904).
(3) Output a value of the validated measure of the primary current (500) lye obtained from an output (200a) of magnetic current measuring sensor (221).
(4) Discard the output (200b) of the impedance current measuring sensor (261).
(5) Discard the output (200c) of the temperature sensor (301).
(6) If any current measuring sensor (200) in non-operational or if a difference in value of measured current by the magnetic current measuring sensor (221) and the resistance current measuring sensor (261) is more than the prescribed percentage (904), which implies that any or all current measuring sensors (200) are operational but outside a tolerance limit, then invoke a fault mode (912) of the computing device (400) and output the validated measure of the primary current (500) lye in the fault mode (912), which implies that the computing device (400) outputs the next best value of the primary current (500), ensuring at all times to output the safe value in accordance with actual application where the combination sensing device (100) as per present invention is deployed.

Illustrating for the present embodiment,
(a) If the output (200a) of the magnetic current measuring sensor (221) is absent, then output the validated measure of the primary current (500) obtained from the resistance current measuring device (261) after correcting for temperature rise as per known equation:

$$Rs_T = Rs_0(1 + \alpha T + \beta T^2)$$

Where $Rs_T$=Value of resistance of resistance current measuring sensor (261) at temperature T
$Rs_0$=Value of resistance of resistance current measuring sensor (261) at reference temperature
$\alpha, \beta$=Electrical Constants of a material of impedance current measuring sensor (261)

(b) If the output (200c) of the temperature sensor (301) is also absent, then output the validated measure of the primary current (500) obtained from the resistance current measuring device (261) without correcting for temperature rise.

If the output (200a) of the magnetic current measuring sensor (221) and or the output (200b) of the impedance current measuring sensor (261) falls in the second range (502) then the computing device (400) executes as follows:
(1) Verify that measured value of the magnetic current measuring sensor (221) as well as of the impedance current measuring sensor (261) falls in the appropriate range (903) which is the second range (502), which implies that the current measuring sensors (200) are operational (901).
(2) Apply consistency check, like verify that the difference in value of measured current by the magnetic current measuring sensor (221) and the resistance current measuring sensor (261) is less than the prescribed percentage (904).
(3) Output the validated measure of the primary current (500) obtained from an output (200b) of the resistance current measuring sensor (261) after correcting for temperature rise as per known equation:

$$Rs_T = Rs_0(1 + \alpha T + \beta T^2)$$

Where $Rs_T$=Value of resistance of resistance current measuring sensor (261) at temperature T
$Rs_0$=Value of resistance of resistance current measuring sensor (261) at reference temperature
$\alpha, \beta$=Electrical Constants of a material of impedance current measuring sensor (261)
(4) Discard the output (200a) of the magnetic current measuring sensor (221).
(5) If any current measuring sensor (200) in non-operational or if a difference in the value of the measured current by the magnetic current measuring sensor (221) and the impedance current measuring sensor (261) is more than the prescribed percentage (904), which implies that any or all current measuring sensors are operational but outside the tolerance limit, then invoke the fault mode (912) of the computing device (400) and output the validated measure primary current (500) in the fault mode (912), which implies that the computing device (400) outputs the next best value of the primary current (500), ensuring at all times to output the safe value in accordance with actual application where the combination sensing device (100) as per present invention is deployed.

Illustrating for the present embodiment,
(a) If the output (200b) of the impedance current measuring sensor (261) is absent, then output the validated measure of the primary current (500) obtainable by the magnetic current measuring device (221).
(b) If the output (200c) of the temperature sensor (301) is absent, then output the uncorrected value of the impedance current measuring sensor (261).

In all situations, the voltage measuring device (150), if present, determines a voltage (151) of the electric source (51); the voltage measuring device (150) in combination with the current measuring sensors (200) and ambience measuring sensors (300) determines a capacity and a health of the electric source (51). Essentially, functions of voltage, current and temperature of the electric source (51) are determined, illustratively—a charge of the electric source (51) and an operating temperature, when the electric source (51) is a battery bank.

Figure 11:
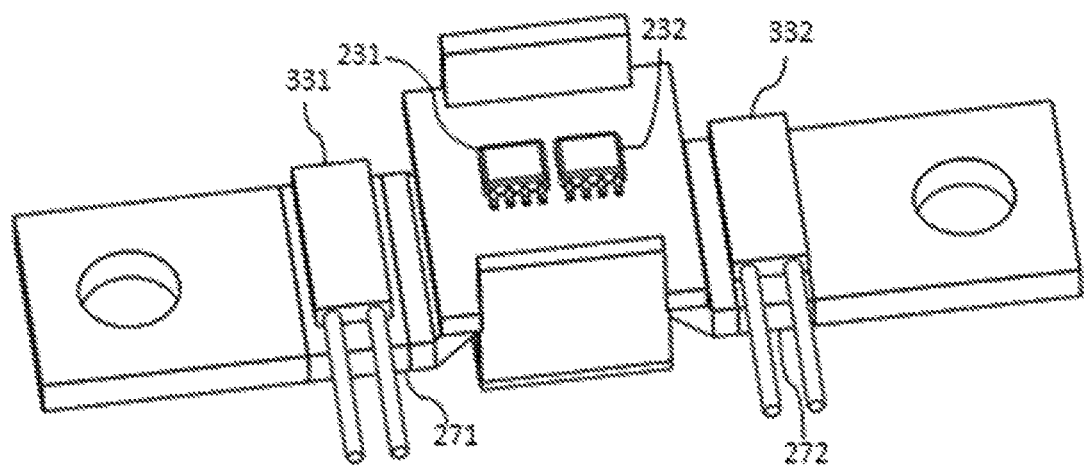
FIG. 11 is a partial perspective view of another embodiment.
Figure 12:
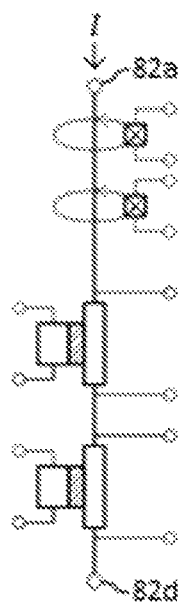
FIG. 12 is a schematic of current measuring sensors and ambience measuring sensors for the embodiment of FIG. 11.
Figure 14:
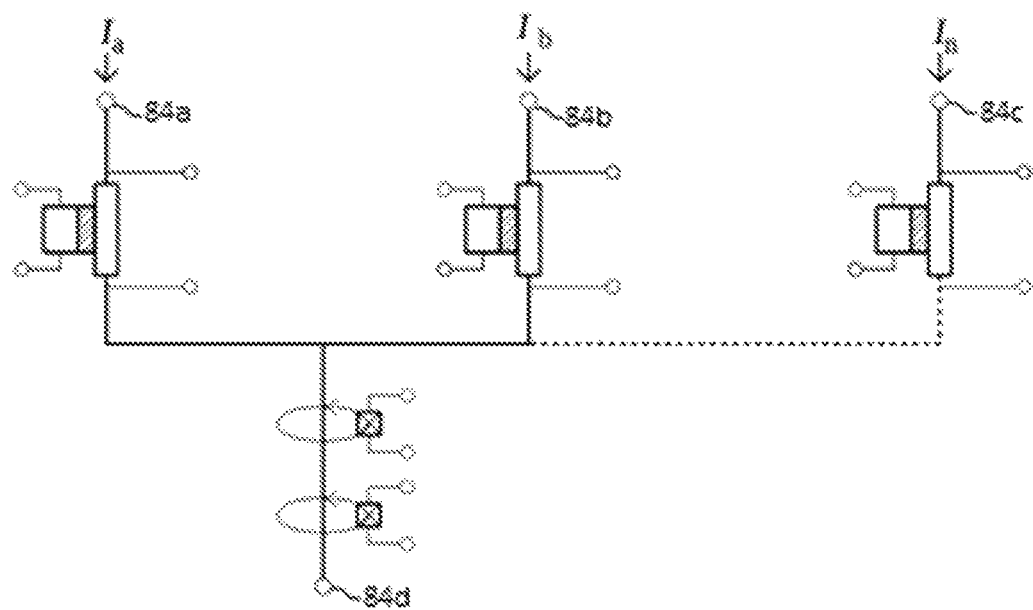
FIG. 14 is a schematic of current measuring sensors and ambience measuring sensors for yet another embodiment.

FIG. 11 and FIG. 12 show another embodiment where there are two magnetic current measuring sensors (231, 232), two impedance current measuring sensors (271, 272) and two temperature sensors (331, 332). While there is a single incoming connection (82a) and a single outgoing connection (82d) in this embodiment. FIG. 13 describes another embodiment with two incoming connections (83a, 83b) and FIG. 14 shows yet another embodiment with three incoming connections (84a, 84b, 84c). Each incoming connection may be connected to an electric load of different magnitude (55a, 55b) with or without switching (56) there between as shown in FIGS. 13 and 13A. There can be numerous such variations having a plurality of incoming connections, a plurality of outgoing connections with the plurality of magnetic current measuring sensors, the plurality of impedance current measuring sensors and the plurality of ambience measuring sensors, each sensor interacting with the electric current of the electric circuit (50) or a part of the electric current of the electric circuit (50).

For embodiments with a plurality of incoming connections and or a plurality of outgoing connections, another consistency check (904) of equality of a summation of incoming electric current and outgoing electric current is performed by the computing device (400). FIG. 17.

Figure 11A:
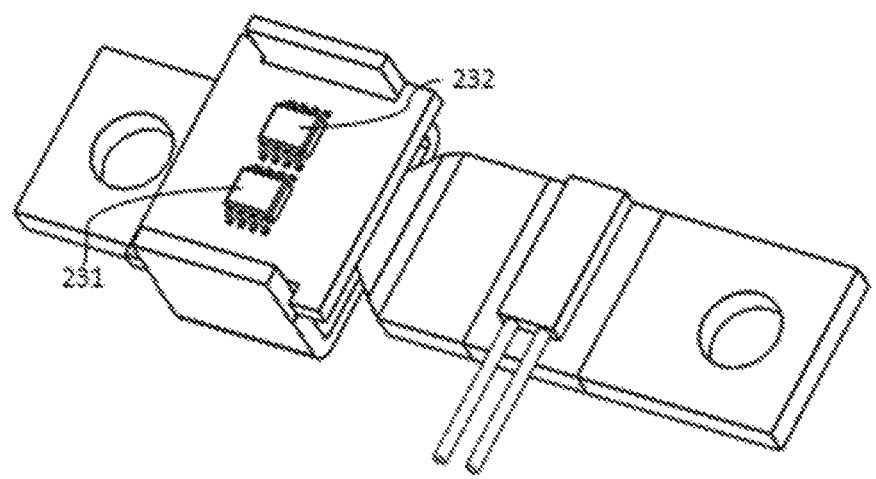
FIG. 11A is a partial perspective view of yet another embodiment.
Figure 15:
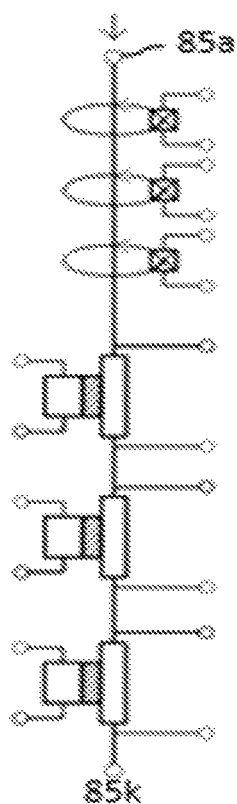
FIG. 15 is a schematic of current measuring sensors and ambience measuring sensors for yet another embodiment.
Figure 16:
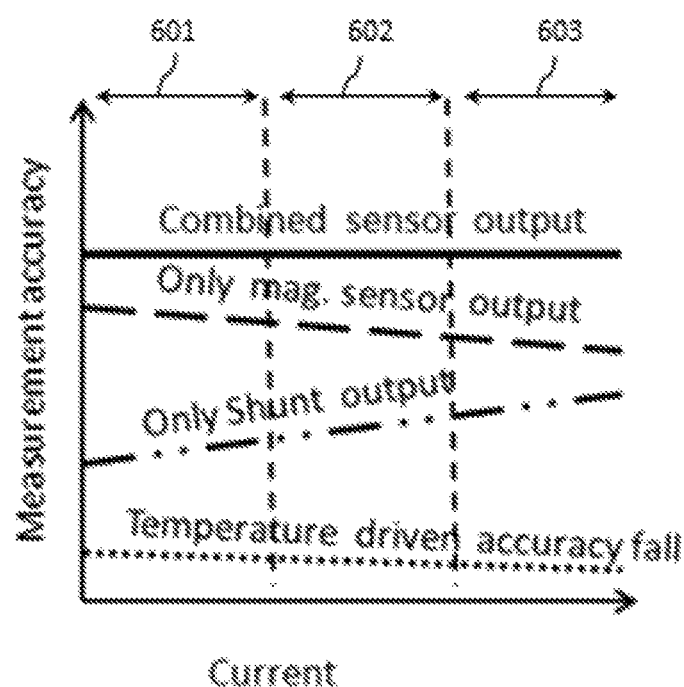
FIG. 16 is a line graph illustrating accuracies of sensors over different ranges.

Notably, FIG. 11 and FIG. 11A describe another variation with a plurality of magnetic current measuring sensors (231, 232). In embodiment of FIG. 11, the magnetic current measuring sensor (231) and the magnetic current measuring sensor (232) interact with different magnetic lines of forces (90) simultaneously. On the other hand, in embodiment of FIG. 11A, the magnetic current measuring sensor (231) and the magnetic current measuring sensor (232) interact with same magnetic lines of forces (90) serially. Such dual magnetic current measuring sensors (231, 232) may be realized with:
a) Silicon CMOS Hall for high current, and
b) GaAs, magnetoresistive for low currents FIG. 15 is another combination current sensing device (100), having three magnetic current measuring sensors, three impedance current measuring sensors and three ambience measuring sensors, with a single incoming connection (85a) and a single outgoing connection (85k). An illustrative non exhaustive set of executable instructions configured in the computing device (400) for such variant would be as follows:
The range of electric current measure divided into a first range (601), a second range (602) and a third range (603), as shown in FIG. 16.
the magnetic current measuring sensor output is preferred for the first range (601) while the impedance sensor output is preferred for the second range (602) and the third range (603);
a magnetic sensor output is preferred over an uncorrected impedance sensor output;
a lower value of circuit current is considered more unsafe than a higher value of circuit current.

FIG. 18, for this embodiment, nine different validated outputs (410) are normally available as input to the computing device (400) for any and every value of the primary current (500), which are:
a measure from a first magnetic current measuring sensor
a measure from a second magnetic current measuring sensor
a measure from a third magnetic current measuring sensor
a measure from a first impedance current measuring sensor—uncorrected for temperature
a measure from a second impedance current measuring sensor—uncorrected for temperature
a measure from a third impedance current measuring sensor—uncorrected for temperature
a measure from the first impedance current measuring sensor corrected for temperature
a measure from the second impedance current measuring sensor corrected for temperature
a measure from the third impedance current measuring sensor corrected for temperature Depending on value of primary current (500) being measured, a precision level (420) of above possible values changes. For example, for a value of primary current (500) falling in the first range (601), the measure from the first magnetic current measuring sensor shall be Precision Level 1, while for a value of primary current (500) falling in the second range (602), the measure from the second impedance current measuring sensor shall be at Precision Level 1. Based on the set of executable instructions configured on the computing device (400), the computing device (400) sends as output the most precise value, along with the precision level (420), as indicated by FIG. 18.

Thus, at all times the user gets an output from the device along with the precision level, so the user also knows about health of combination current sensor and can initiate repair and maintenance action. In other words, the combination current sensing device (100) as per present invention has high functional safety.

Besides the precision level (420), the computing device (400) also sends other auxiliary information (911), such as, but not limited to:
Temperature
Power dissipation
Capacity of the electric source (51)
Voltage of the electric source (51)
Overcurrent information
Diagnostic results
Safety warnings
Health of electric source (51)

When the electric source (51) is a Battery Management System, the health of the electric source (51) includes an electric charge and other functions of the Battery Management System configured in the computing device (400).

The ambience measuring sensor (300) considered in the description is a temperature sensor, however one or more of the ambient measuring sensor (300) may be a current harmonic measuring sensor, a vibration measuring sensor, a decibel measuring sensor or any other sensor which detects quality of current and or ambient condition impacting health of the combination current sensing device (100) as per present invention.

We claim:

1. A combination current sensing device (100) connectible in an electric circuit (50) fed by an electric Source (51) with a current 1e, the combination current sensing device (100) comprising:
a plurality of current measuring sensors (200) further comprising at least a magnetic current measuring sensor (221, 231 and or 232) and at least an impedance current measuring sensor (261, 271 and or 272) including a resistance measuring sensor (261, 271 and or 272);
an optional ambience measuring sensor (300);
a computing device (400);
a circuit board assembly (30) comprising a connector (31);
a bar conductor (60) having a reduced width (62a); and
a controlled module assembly (80) having
a base chamber (10), further comprising a plurality of bar locators (11), a plurality of board locators (12) and a tunnel (13); and an open cover (20), further comprising a bar slot (21) on two opposite sides of a slot width (24) more than a bar width (62) of the bar conductor (60);

the ambience measuring sensor (300) disposed on the bar conductor (60), the magnetic current measuring sensors (221, 231 and or 232) disposed on the circuit board assembly (30), and the impedance current measuring sensor (261, 271 and or 272) integrally disposed on the bar conductor (60), the combination current sensing device (100) having at least one incoming connection including a first incoming connection (81*a*, 82*a*) and at least one outgoing connection including a first outgoing connection (81*d*, 82*d*), the at least one additional incoming connection (83*b*, 84*b*, 84*c*) in addition to the first incoming connection (81*a*, 82*a*) and or at least one additional outgoing connection (83*d*, 84*d*) in addition to the first outgoing connection (81*d*, 82*d*) are each connected to an electric load (52), the computing device (400) outputting a validated measure of a primary current (500) Ive, and the computing device (400) is optionally external to the combination current sensing device (100).

2. A combination current sensing device (100) connectible in an electric circuit (50) fed by an electric Source (51) with a current Ie, the combination current sensing device (100) comprising:
    a plurality of current measuring sensors (200) further comprising at least a magnetic current measuring sensor (221, 231 and or 232) and at least an impedance current measuring sensor (261, 271 and or 272) including a resistance measuring sensor (261, and or 272);
    an ambience measuring sensor (300);
    a voltage measuring device (150);
    a computing device (400);
    a circuit board assembly (30) comprising a connector (31);
    a bar conductor (60) having a reduced width (62*a*); and
    a controlled module assembly (80) having
        a base chamber (10), further comprising a plurality of bar locators (11), a plurality of board locators (12) and a tunnel (13); and
        an open cover (20), further comprising a bar slot (21) on two opposite sides of a slot width (24) more than a bar width (62) of the bar conductor (60);
    the ambience measuring sensor (300) disposed on the bar conductor (60), the magnetic current measuring sensors (221, 231 and or 232) disposed on the circuit board assembly (30) and the impedance current measuring sensor (261, 271 and or 272) integrally disposed on the bar conductor (60), the combination current sensing device (100) having at least one incoming connection (81*a*, 82*a*) and at least one outgoing connection (81*d*, 82*d*), a more than one incoming connection (83*b*, 84*b*, 84*c*) besides the at least one incoming connection (81*a*, 82*a*) and or a more than one outgoing connection (83*d*, 84*d*) besides the at least one outgoing connection (81*d*, 82*d*) are each connected to an electric load (52), the computing device (400) outputting a validated measure of a primary current (500) Ive, the voltage measuring device (150) determines a voltage (151) of the electric source (51), the voltage measuring device (150) in combination with the current measuring sensors (200) and ambience measuring sensors (300) determine a capacity and a health of the electric source (51), and the computing device (400) is optionally external to the combination current sensing device (100).

3. The combination current sensing device (100) as claimed in claim 1 or 2, wherein the bar conductor (60) has at least one referencer (64).

4. The combination current sensing device (100) as claimed in claim 1 or 2, wherein the combination current sensing device (100) further comprises a magnetic field concentrator (70).

5. The combination current sensing device (100) as claimed in claim 4, wherein the magnetic field concentrator (70) further comprises at least two parallel walls (71), each parallel wall (71) having at least one step (73).

6. The combination current sensing device (100) as claimed in claim 1 or 2, wherein the circuit board assembly (30) mounted on the bar conductor (60) and the bar conductor (60) are in a defined position with respect to each other, maintaining a prescribed electrical isolation (81) between the bar conductor (60) and a magnetic field concentrator (70).

7. The combination current sensing device (100) as claimed in claim 1 or 2, wherein the validated measure of the primary current (500) Ive value in a fault mode (912) is at least one of a measure from any of the magnetic current measuring sensors (221, 231 and or 232), a measure from any of the impedance current measuring sensors (261, 271 and or 272), uncorrected for temperature and a measure from any of the impedance current measuring sensors (261, 271 and or 272), corrected for temperature, in accordance with a precision level (420).

8. The combination current sensing device (100) as claimed in claim 1 or 2, wherein the computing device (400) outputs an auxiliary information (911), comprises:
    a Precision level (420);
    a Temperature;
    a Power dissipation;
    a Charge accumulation;
    an Overcurrent Information;
    a Health of electric source (51);
    a Capacity of the electric Source (51)
    a Voltage of the electric Source (51)
    a Diagnostic results; and or
    a Safety warning.

9. The combination current sensing device (100) as claimed in claim 8, wherein the auxiliary information (911) comprises a precision level (420) based on a first range (601), a second range (602), a third range (603), and a safe value, the safe value is at least one of a lower value of current and a higher value of current configured in the computing device (400) as per application.

10. The combination current sensing device (100) as claimed in claim 1 or 2, wherein the ambience measuring sensor (300) is at least one of a temperature sensor (301), a current harmonic measuring sensor, a vibration measuring sensor, a decibel measuring sensor, a sensor detecting a quality of current and ambient condition impacting an output of the combination current sensing device (100).

11. The combination current sensing device (100) as claimed in claim 1 or 2, wherein the circuit board assembly (30) is disposed on the reduced width (62*a*).

12. The combination current sensing device (100) as claimed in claim 1 or 2, wherein the circuit board assembly (30) is disposed on either side of the bar width (62) of the bar conductor (60).

13. The combination current sensing device (100) as claimed in claim 1 or 2, wherein the bar conductor (60) has at least a slot (63), a magnetic field concentrator (70) is made to pass through the at least one slot (63) and a filler material (72*a*) which is an electrical insulator and simultaneously a thermal conductor is disposed all around the magnetic field concentrator (70) in the each slot (63).

14. The combination current sensing device (100) as claimed in claim 13, wherein the slot (63) is a closed slot for splitting the primary current (500) Ive.

15. The combination current sensing device (100) as claimed in claim 13, wherein the slot (63) is an open slot with a slit (67) on an outer side (54) of the bar conductor (60).

16. The combination current sensing device (100) as claimed in claim 2, wherein the health of the electric Source (51) includes an electric charge and other functions of a Battery Management System configured in the computing device (400) when the electric source (51) is a Battery.

17. A combination current sensing device (100) connectible in an electric circuit (50) with a current Ie, the combination current sensing device (100) comprises:
   a plurality of current measuring sensors (200) further comprising at least one magnetic current measuring sensor (221, 231 and or 232) and at least one impedance measuring sensor (261, 271 and or 272);
   an ambience measuring sensor (300);
   a circuit board assembly (30);
   a bar conductor (60) having a plurality of joining means (69), a rectangular face (61), a bar width (62), a plurality of referencers (64);
   at least one magnetic field concentrators (70) further comprising at least two parallel walls (71), each parallel wall (71) having at least one step (73), the magnetic field concentrator (70) surroundingly disposed around the bar conductor (60), substantially equally spread around the magnetic current measuring sensor (221, 231 and or 232) present on the bar conductor (60); and
   a controlled module assembly (80) comprising
      a base chamber (10), further comprising a plurality of bar locators (11), a plurality of board locators (12) and a tunnel (13); and
      an open cover (20), further comprising a bar slot (21) on two opposite sides of a slot width (24) slightly more than the bar width (62) of the bar conductor (60), the controlled module assembly (80) constraining the circuit board assembly (30) having the at least one magnetic current measuring sensors (221), the magnetic field concentrator (70) and the bar conductor (60) in a defined position with respect to one another and maintaining a prescribed electrical isolation between the bar conductor (60) and the magnetic field concentrator (70); the process of assembling the controlled module assembly (80) comprises the steps of:
   (i) Placing a circuit board assembly (30) on board locators (12) in the base chamber (10);
   (ii) Placing the bar conductor (60) on the base chamber (10) within bar locators (11) of the base chamber (10) such that the base chamber (10) is constrained within the plurality of referencers (64) on the bar conductor (60);
   (iii) Placing parallel walls (71) of magnetic field concentrator (70) in the open passage (32) of the circuit board assembly (30), such that the steps (73) on the parallel walls (71) stop against the extended legs (33) of the circuit board assembly (30), such that there is a predetermined gap (81) between the bar conductor (60) and the magnetic field concentrator (70), and a connector (31) on the circuit board assembly (30) gets accommodated and is accessible through the tunnel (13) of the base chamber (10);
   (iv) Placing an open cover (20) such that the open cover (20) is constrained by the bar conductor (60) passing through bar slots (21) of the open cover (20);
   (v) Filling an insulating resin through the open cover (20).

18. A process of outputting a validated measure of a primary current (500) lye and an auxiliary information (911) by a combination current sensing device (100) connectible in an electric circuit (50), fed by an electric source (51) with a current Ie, the combination current sensing device (100) comprising:
   a combination current sensing device (100) which further comprises a plurality of current measuring sensors (200) further comprising at least a magnetic current measuring sensor (221, 231 and or 232), at least an impedance current measuring sensors (261 or 271 and 272) and at least an optional ambience measuring sensor (300); a computing device (400); a voltage measuring device (150); a circuit board assembly (30); and a bar conductor (60); the computing device (400) outputting the validated measure of the primary current (500) lye value and the auxiliary information (911) according to a plurality of range and a safe value of the primary current (500); the process of outputting the validated value of the primary current (500) Ive and the auxiliary information (911) comprises the steps of:
   (i) Inputting an output (200a) of the at least one magnetic current measuring sensor (221), an output (200b) of at least one impedance current measuring sensor (261) and an output (200c) of the at least one optional ambience measuring sensor (300) to the computing device (400);
   (ii) Verifying that measured value of the magnetic current measuring sensor (221) as well as of the impedance current measuring sensor (261) falls in any of the defined range;
   (iii) Applying a consistency check, including verifying that the difference in value of measured current by the magnetic current measuring sensor (221) and the resistance current measuring sensor (261) is less than a prescribed percentage (904);
   (iv) Outputting a voltage of the electric source (51);
   (v) Outputting, in combination with the voltage measuring device (150), the current measuring sensors (200) and ambience measuring sensors (300) determine a capacity and a health of the electric source (51);
   (vi) Outputting a value of the validated measure of the primary current (500) lye which is the highest in a precision level (420), obtained from an output (200a) selected from a plurality of outputs from the plurality of current measuring sensors (200) and outputting a corresponding precision level (420); and
   (vii) Invoking a fault mode (912) of the computing device (400) and outputting the validated measure of the primary current (500) lye in the fault mode (912) and outputting corresponding precision level (420), whereby the computing device (400) outputs the next best value of the primary current (500) as per predefined precision levels, simultaneously ensuring outputting a predefined safe value if any current measuring sensor (200) is non-operational or if a difference in value of measured current by the magnetic current measuring sensor (221) and the impedance current measuring sensor (261) is more than the prescribed percentage (904).

19. The process of outputting the validated measure of the primary current (500) lye value and the auxiliary information (911) as claimed in claim 18, wherein the validated measure of the primary current (500) lye value in the fault mode (912) is at least one of:
- a measure from any of the magnetic current measuring sensors (221, 231 and or 232);
- a measure from any of the impedance current measuring sensors (261, 271 and or 272), uncorrected for temperature; and
- a measure from any of the impedance current measuring sensors (261, 271 and or 272), corrected for temperature, in accordance with the precision level (420).

20. The process of outputting the validated measure of the primary current (500) lye value and the auxiliary information (911) as claimed in claim 18, wherein the consistency check is performed by the computing device (400) for a plurality of incoming connections and or a plurality of outgoing connections.

21. The process of outputting the validated measure of the primary current (500) lye value and the auxiliary information (911) as claimed in claim 18, wherein the capacity and the health of the electric source (51) is a function of a voltage, a current and an operating temperature of the electric source (51) which is a battery bank.

* * * * *

UNITED STATES PATENT AND TRADEMARK OFFICE
CERTIFICATE OF CORRECTION

PATENT NO. : 11,313,881 B2
APPLICATION NO. : 16/626922
DATED : April 26, 2022
INVENTOR(S) : Peter Krummenacher and Sharad Taparia It is certified that error appears in the above-identified patent and that said Letters Patent is hereby corrected as shown below:

On the Title Page

Item (73) Assignee identified as "Pregna International Limited" shall be changed to "MAGLAB LIMITED PERMANENT MAGNETS LIMITED"

Signed and Sealed this
Seventh Day of June, 2022

Katherine Kelly Vidal
*Director of the United States Patent and Trademark Office*